United States Patent [19]

Martens

[11] Patent Number: 4,835,622
[45] Date of Patent: May 30, 1989

[54] DEMODULATOR ARRANGEMENT

[75] Inventor: Theodorus G. J. A. Martens, Eindhoven, Netherlands

[73] Assignee: U.S. Philips Corp., New York, N.Y.

[21] Appl. No.: 71,006

[22] Filed: Jul. 7, 1987

[30] Foreign Application Priority Data

Jul. 15, 1986 [NL] Netherlands .......................... 8601844

[51] Int. Cl.$^4$ ........................ H04N 5/94; H04N 5/782; H03D 3/24
[52] U.S. Cl. ................................. 358/336; 328/114; 329/131; 358/167; 360/38.1
[58] Field of Search ................ 360/38.1, 29, 30, 33.1; 358/326, 327, 314, 336, 315, 166, 167, 36, 340; 328/167, 114, 132; 307/517, 520; 329/131, 132, 122

[56] References Cited

U.S. PATENT DOCUMENTS

| | | | |
|---|---|---|---|
| 4,117,410 | 9/1978 | Bender | 329/50 |
| 4,361,813 | 11/1982 | Watatani | 360/30 |
| 4,403,262 | 9/1983 | Ito et al. | 360/30 |
| 4,604,659 | 8/1986 | Itoh et al. | 360/38.1 |
| 4,688,103 | 8/1987 | Akiyama | 358/326 |
| 4,692,914 | 9/1987 | Yasumura et al. | 360/38.1 |

Primary Examiner—Donald McElheny, Jr.
Attorney, Agent, or Firm—Bernard Franzblau

[57] ABSTRACT

A demodulator arrangement including a phase-locked loop PLL (11) having an output (17) coupled to an input (23) of a hold circuit (24) also includes detection means (27) for detecting an instantaneous interference (FIG. 4b) in the signal present at the input (10) of the PLL (11) and for subsequently generating a control signal (FIG. 4e) which is applied to a control input (29) of the hold circuit. The hold circuit is adapted to retain the signal applied to its input (23) during the time interval ($T_3$) when the control signal is presented to its control input (27). The detection means (27) are adapted to determine a phase-lock error between the signal at the input of the PLL (11) and the signal at the output (20) of a voltage-controlled oscillator VCO (19) associated with the PLL (11) and to generate the control signal if the phase-lock error exceeds a given value, for example, 45°. A better detection of the instantaneous interferences can be realized with such an arrangement in comparison with the use of the amplitude information (if present) of the signal at the input (10) of the PLL (11).

7 Claims, 2 Drawing Sheets

DEMODULATOR ARRANGEMENT

BACKGROUND OF THE INVENTION

This invention relates to an arrangement comprising an input terminal for receiving an electric input signal, which terminal is coupled to an input of a phase-locked loop having an output coupled to an input of a hold circuit having an output coupled to an output terminal of the arrangement for supplying an electric output signal. The phase-locked loop comprises a phase comparator having a first input coupled to the input of the phase-locked loop, a second input and an output, a low-pass filter having an input and an output coupled to the output of the phase comparator and to the output of the phase-locked loop, respectively, a voltage-controlled oscillator having an input and an output coupled to the output of the low-pass filter and to the second input of the phase comparator, The arrangement further comprises detection means for detecting an instantaneous interference in the input signal of the phase-locked loop and for subsequently generating a control signal and for applying said control signal to an output which is coupled to a control input of the hold circuit. The hold circuit is adapted to retain the signal applied to its input under the influence of the control signal.

An arrangement of this type may be incorporated, for example, in a video recorder for demodulating, after reading a registration carrier, an audio signal which is written in FM-modulated form into the registration carrier, for which purpose the arrangement further comprises:

two or more reading heads provided on a rotatable head drum, switching means having two or more inputs, an output and a control input, which switching means are adapted to couple one of the inputs to the output under the influence of a control signal to be applied to the control input, an output of each of the two or more reading heads being coupled to an associated input of the two or more inputs of the switching means and the output of the switching means being coupled to an input of a limiter which is coupled between the input terminal of the arrangement and an input of the detection means.

The arrangement is intended to compensate for instantaneous interferences in the input signal of the phase-locked loop. This input signal is an FM-modulated signal in its use in video recorders. The instantaneous interferences are those interferences affecting the regularity in the aforementioned signal. These interferences may be, for example, drop-outs or drop-ins in the input signal of the phase-locked loop or sudden phase changes in this input signal which are produced as a result of switching over from reading one registration carrier with the one reading head to reading with another reading head. These instantaneous interferences result in the phase-locked loop being deregulated so that the voltage-controlled oscillator in the phase-locked loop (hereinafter the phase-locked loop will be referred to as "PLL") can no longer (satisfactorily) follow the input signal of the PLL. This in turn results in (audible) interferences occurring in the PLL-demodulated audio signal.

It is known to energize the hold circuit during the head switching operation so that the audio signal, which was present just before the head switching operation at the output of the PLL, is retained. This is a satisfactory solution for low-frequency audio signals. In the case of high-frequency audio signals, however, a continuity error may occur which may be very disturbing. Moreover, the purely periodic character of energizing the hold circuit at the frequency of the head switching operation produces an additional interference in the output signal of the arrangement.

SUMMARY OF THE INVENTION

It is an object of the invention to provide an arrangement which is better able to compensate for instantaneous interferences in the PLL input signal. To this end the arrangement is characterized in that the detection means are adapted to determine a phase-lock error between the input signal of the phase-locked loop and the output signal of the voltage-controlled oscillator and to generate the control signal if said phase-lock error exceeds a given value, and in that the detection means comprise a time slot circuit and a slope detector circuit, and the output of the voltage-controlled oscillator is coupled to an input of the time slot circuit an output of which is coupled to a first input of the slope detector circuit, the input of the phase-locked loop being coupled to a second input of the slope detector circuit an output of which is coupled to the output of the detection means and the slope detector circuit being adapted to supply a detection signal from its output if there is at least one level transition in the signal applied to its second input within the time slot determined by the time slot circuit.

When the PLL accurately follows the input signal, there is a phase difference of 90° between the signals, which are presented to the first and the second input of the phase comparator. If the PLL follows the input signal less accurately, then there is a deviation with respect to this phase difference of 90°. This deviation is referred to as the phase-lock error. If the phase-lock error exceeds the aforementioned given value $\phi_0$ which is equal to, for example, ±45°, a control signal is supplied by the detection means. Thus this means that the detection means supply the control signal if the phase difference (or the phase error) between the signals presented to the first and the second input of the phase comparator is smaller than $90° - \phi_0$ or larger than $90° + \phi_0$.

The said value $\phi_0$ is to be chosen in such a manner that the detection means do not react to the variations in the phase error between the two above-mentioned signals which are always present anyway due to the modulatin of the PLL input signal. This means that the value $\phi_0$ must not be too small, for example, a value which is preferably not below 45°.

The invention is based on the following recognition. Interferences in the input signal of the PLL lead to phase differences between this input signal and the output signal of the voltage-controlled oscillator (hereinafter referred to as VCO) which are larger as the interference in the input signal of the PLL is larger. Besides, small interferences in the PLL input signal are inaudible so that in that case the hold circuit need not be energized. The periodic character in energizing the hold circuit may thus disappear while in addition the possibility is provided to adapt the length of the energizing period of the hold circuit to the length of the interference.

It is known from the literature to detect drop-outs by using an automatic volume control (AGC) with a relatively large time constant followed by a level detector. In the case of an interference-free input signal for the AGC, the AGC will represent a signal at a given level to the level detector. If there is a sudden drop-out in the AGC input signal, the input signal of the level detector will also drop suddenly and the level detector will apply a control signal to the hold circuit. Such a control thus utilizes the amplitude information in the AGC input signal, whereas in the arrangement according to the invention use is made of a detection of the phase-lock error between the PLL input signal and the VCO output signal to determine whether there is an instantaneous interference in the input signal or not. Preferably there is no amplitude information present in the input signal of the detection means, which is achieved by connection of the previously mentioned limiter ahead of the detection means. The limiter is preferably also arranged in front of the PLL. A square-shaped signal is then obtained from of the FM-modulated signal.

In the embodiment of the invention described above, the time slot determined by the time slot circuit is chosen so that in the case of a phase-lock error of the previously mentioned value as a maximum, there is still no level transition within this time slot in the signal applied to the second input of the slope detector circuit. The time slot is taken to be equal to, for example, a quarter of the duration of the period of the PLL input signal. Furthermore, the time slot is preferably placed in the centre of the time interval between two successive level transitions in the non-interfered PLL input signal. In that case the detection means will supply a control signal if a phase-lock error of more than 45° is produced.

The arrangement may be further characterized in that the slope detector curcuit is adapted to supply a detection signal in the form of a pulse and in that a pulse stretcher is coupled between the output of the slope detection circuit and the output of the detection means for stretching the pulse of the slope detector circuit to a pulse having a given nominal pulse width. This results in the hold curcuit being activated long enough so that the PLL has a (small) phase-lock error after the occurrence of the interference. As a result there is no longer any level transition within the time slot.

The pulse stretcher may be further adapted to stretch this pulse having a nominal pulse width by at least a value corresponding to the time interval between the pulse of the slope detector circuit and a subsequent pulse of the slope detector circuit if this time interval is smaller than the said nominal pulse width. This results in the activation of the hold curcuit being maintained in the case of a long-lasting interference or in the case of a recurrent interference.

An integrator may be incorporated between the output of the slope detector circuit and the input of the pulse stretcher. This increases the reliability of the detection.

A delay means is preferably incorporated between the PLL output and the input of the hold circuit. This delay means is provided to compensate for the delay produced in the detection means.

BRIEF DESCRIPTION OF THE DRAWINGS

The invention will now be described in greater detail with reference to a number of embodiments shown in the drawings. In the drawings.

It is to be noted that elements having the same reference numerals in the different Figures are identical.

DETAILED DESCRIPTION OF THE INVENTION

Figure 1:
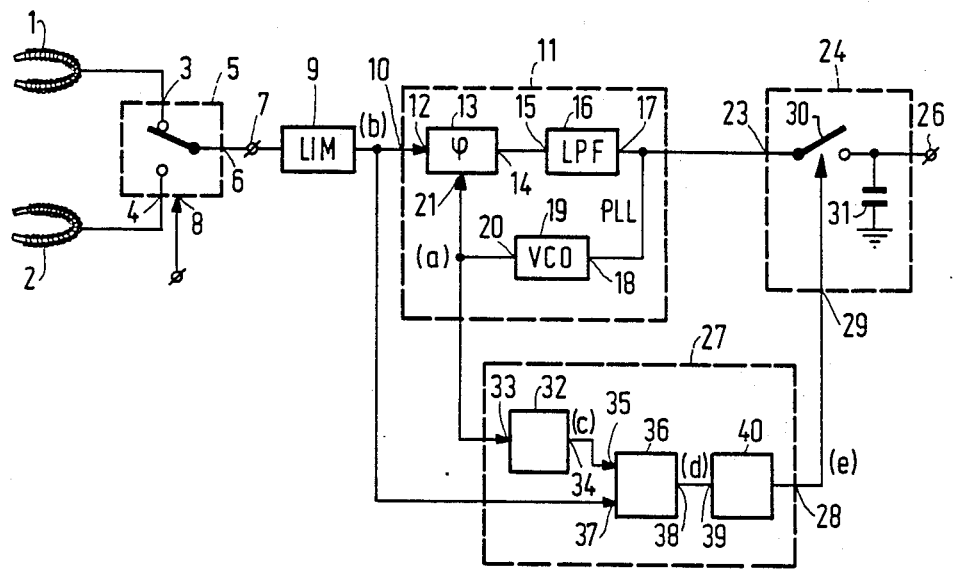
FIG. 1 shows a first embodiment.

FIG. 1 shows an embodiment of the arrangement used in a video recorder. A number (in this case two) of reading heads 1 and 2 provided on a rotatable head drum (not shown) are coupled to inputs 3 and 4, respectively, of switching means 5. The output 6 of the switching means is coupled to the input terminal 7 of the arrangement. The switching means 5 are adapted to couple one of the inputs 3, 4 to the output 6 under the influence of a control signal to be applied to a control input 8. This control signal can be supplied by a control unit (not shown) which can derive this control signal from an internal clock in the control unit which can be synchronized in one way or another with the signal read by the reading heads of a magnetic registration carrier (not shown).

The input terminal 7 is coupled via a limiter 9 to an input 10 of a phase-locked loop (or PLL) 11. The input 10 of the PLL is coupled to an input 12 of a phase comparator 13, the output 14 of which is coupled to the input 15 of a low-pass filter (LPF) 16. The output 17 of the low-pass filter, being the output of the PLL 11, is coupled to the input 18 of a voltage-controlled oscillator (VCO) 19, the output 20 of which is coupled to the second input 21 of the phase comparator 13. The output 17 of the PLL 11 is coupled to the input 23 of the hold circuit 24. The output 26 of the hold circuit 24 constitutes the output terminal of the arrangement. Furthermore the arrangement comprises detection means 27 for detecting an instantaneous interference in the input signal of the PLL 11 and for subsequently generating a control signal at an output 28, which signal is applied to the control input 29 of the hold circuit 24. The control signal operates a switch 30 in the hold circuit 24. In the absence of the control signal the switch 30 is closed and the capacitor 31 of the hold circuit 24 is charged to the level of the electric signal which is presented to the input 23 and which is thus present at the output 26. If a control signal is presented to the control input 29, the switch 30 is opened. The level of the electric signal at the input 23 just before the instant of opening the switch 30 is now retained by the capacitor 31.

The limiter 9 which is arranged in the connection between the input terminal 7 and the input 10 in the embodiment of FIG. 1 may be alternatively incorporated in the connection between the input 10 of the PLL and the input of the detection means 27, corresponding to input 37 of the slope detector circuit 36 (see infra).

The detection means 27 comprise a time slot circuit 32, an input 33 of which is coupled to the output 20 of the VCO and an output 34 is coupled to a first input 35 of a slope detector circuit 36. The input 10 of the PLL 11 is coupled to a second input 37 of the slope detector circuit 36. The output 38 of the slope detector circuit 36 is coupled to an input 39 of a pulse stretcher 40 whose output constitutes the output 28 of the detection means 27.

The FM-modulated (audio) signal read by one of the reading heads 1, 2 of the registration carrier and with a carrier of, for example, 1.5 MHz and a frequency swing of, for example, 100 kHz is amplitude-limited in the limiter 9. Consequently a square-wave signal is presented to the input 10, see FIG. 3b.

Figure 3:
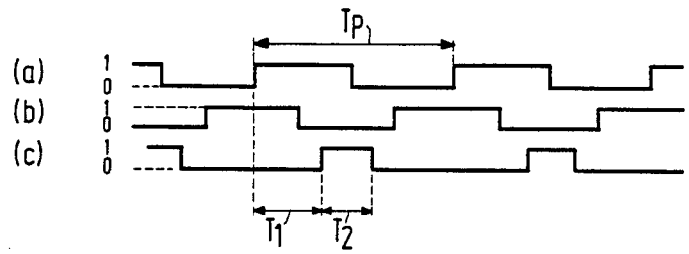
FIG. 3 shows a number of signals as a function of time present at points in the arrangement of FIG. 1, FIG. 4 also shows a number of signals present at points in the arrangement of FIG. 1.

For the sake of simplicity the limiter level is indicated by a logic "1" level in FIG. 3. If this limiter level is indeed to be chosen of this order, the phase comparator 13 can be formed as an "exclusive-OR" (EXOR).

The bandwidth of the PLL 11 is approximately 300 kHz. The PLL 11 functions as an FM demodulator, so that a demodulated analog (audio) signal is supplied from the output 17.

If the PLL 11 is "in lock", then a square-wave is also present at the output 20 of the VCO 19, assuming that the signal at the input 10 is free from interference, see FIG. 3a. However, the signal at the output 20 differs 90° in phase with respect to the signal at the input 10, see FIGS. 3a and b.

Figure 2:
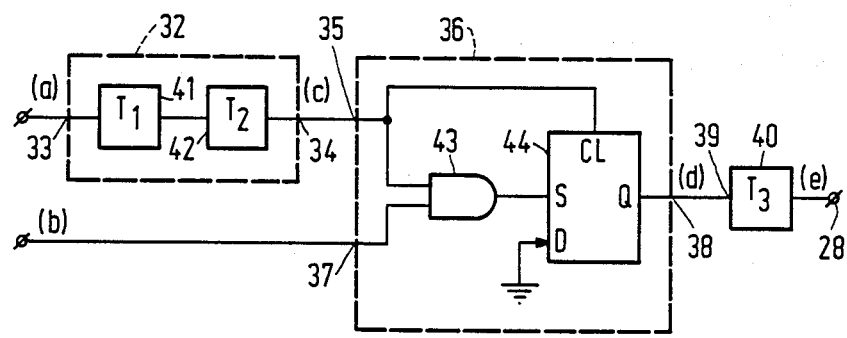
FIG. 2 shows a further elaboration of the detections means of the embodiment of FIG. 1.

FIG. 3c shows the time slot $T_2$ which is realised by the time slot circuit 32 of FIG. 1. A mode of deriving this time slot is shown in FIG. 2. The time slot circuit 32 is built up two monostable multivibrators (MMV) 41 and 42. The MMV 41 generates a pulse having a length $T_1$ at the occurrence of a leading edge in the output signal of the VCO 19, and the MMV 42 generates a pulse having a length $T_2$ at the occurrence of a trailing edge of the pulse of the MMV 41. $T_1$ and $T_2$ are chosen such that the time slot lies in a region within which the input signal 10, if free from interference, has no level transition (thus, for example, a leading or a trailing edge). It is evident from FIG. 3 that $T_2$ is approximately equal to a quarter of the duration of the period $T_p$ and that $T_1$ is approximately equal to $\frac{3}{8} T_p$. This means that the detection means generate a control signal if the phase-lock error between the signals in FIGS. 3a and 3b is larger than ±45°.

Figure 4:
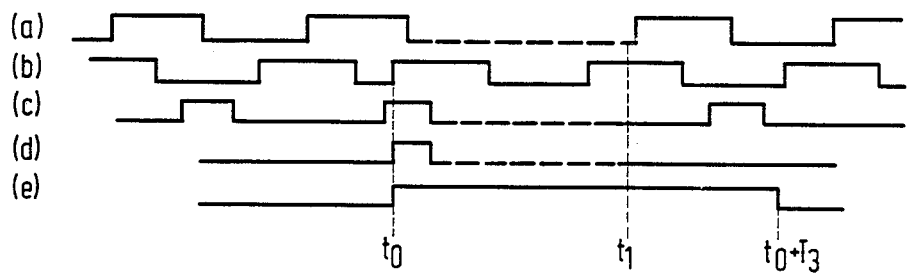

The slope detector circuit 36 in FIG. 1 supplies a pulse from its output 38 if it detects a level transition within the time slot $T_2$ in the signal at its input 37. The slope detector circuit 36 may be in the form as is shown in FIG. 2. The inputs 35 and 37 are coupled to respective inputs of an AND-gate 43, the output of which is coupled to the set-input S of a D-flipflop 44. The input 35 is also coupled to the clock input cl of the D-flipflop 44. A logic "0" is applied to the D-input thereof. The Q-output is the output 38 of the slope detector circuit 36. If a slope is detected by the detector circuit 36, it supplies a pulse which is stretched by the pulse stretcher 40 to a pulse having a nominal pulse width of $T_3$. This is shown in FIG. 4.

As a result of, for example, the head switching operation at the instant $t = t_o$ a sudden phase change is produced in the output signal of the limiter 9, see FIG. 4b. The slope detector circuit 36 detects the leading edge of the signal of FIG. 4b which falls within the second time slot in the signal of FIG. 4c and thereupon supplies a pulse, see FIG. 4d, from its output 38.

Due to the sudden phase change in the input signal of the PLL 11 at the instant $t = t_o$ this PLL gets "out of lock". The output signal of the VCO 19 is therefore not well defined during a given period after $t = t_o$. This is shown by means of the broken line in FIG. 4a. Also the output signals of the time slot circuit 32, FIG. 4c, and the slope detector circuit 36, FIG. 4d, may not be defined during this period. After a given period $t_1 - t_o$ the PLL 11 is "in lock" again. This is shown in FIGS. 4a and 4b because the two signals differ again 90° in phase with respect to each other. FIG. 4e shows the output signal of the pulse stretcher 40. If the slope detector circuit has supplied one pulse at the instant $t = t_o$, see FIG. 4c, the length of the pulse supplied by the pulse stretcher 40 is equal to $T_3$ as is apparent from FIG. 4d.

The operation of the slope detector circuit 36 for obtaining the pulse in FIG. 4d is as follows. At the instant when the two inputs of the AND-gate 43 become logic "1", a leading edge is presented to the set input of the flipflop 44 so that the logic "1" present at the D-input is entered into the flipflop and the Q-output changes from logic "0" to logic "1". The trailing edge at the end of the time slot which is presented to the clear input of the flipflop 44 causes a return of the Q-output from logic "1" to logic "0".

Figure 5:
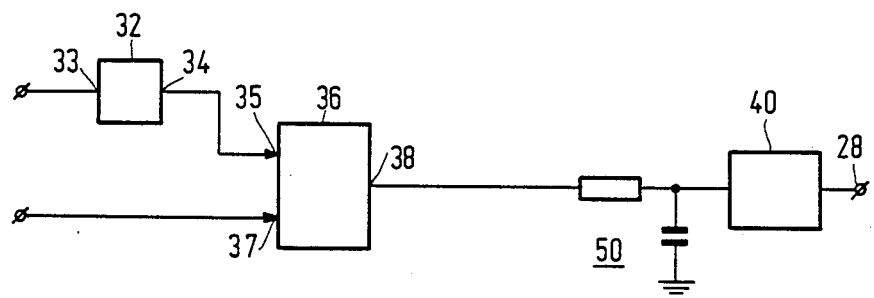
FIG. 5 shows a further elaboration of the detection means.

FIG. 5 shows a further embodiment of the detection means 27 of FIG. 1. The circuit of FIG. 5 also shows an integrator in the form of a low-pass filter 50 arranged between the output 38 of the slope detector circuit 36 and the input of the pulse stretcher 40. The addition of the integrator 50 increases the detection accuracy.

The circuits described hereinbefore are not only suitable for compensating for interferences caused by the head switching operation, but are also suitable for compensating interferences due to drop-outs or drop-ins.

Since the phase-lock error between the input signals at the two inputs 12 and 21 of the phase comparator 13 of course affects the output signal of the phase comparator 13, it is also possible to derive this phase-lock error from the output signal of the phase comparator 13. The input of the detection means is then coupled to the output 14 of the phase comparator 13.

I claim:

1. An arrangement comprising: an input terminal for receiving an electric input signal, means coupling said input terminal to an input of a phase-locked loop having an output coupled to an input of a hold circuit which has an output coupled to an output terminal of the arrangement for supplying an electric output signal, said phase-locked loop comprising a phase comparator having a first input coupled to the input of the phase-locked loop, a second input and an output, a low-pass filter having an input and an output coupled to the output of the phase comparator and to the output of the phase-locked loop, respectively, a voltage-controlled oscillator having an input and an output coupled to the output of the low-pass filter and to the second input of the phase comparator, respectively, detection means for detecting an instantaneous interference in an input signal of the phase-locked loop and for subsequently generating and supplying a control signal to an output which is coupled to a control input of the hold circuit, said hold circuit being adapted to retain a signal applied to its input under the influence of the control signal, characterized in that the detection means is coupled to the phase-locked loop so as to determine a phase-lock error between the input signal of the phase-locked loop and an output signal of the voltage-controlled oscillator and to generate the control signal if said phase-lock error exceeds a given value, wherein the detection means comprise a time slot circuit and a slope detector circuit and with the output of the voltage-controlled oscillator coupled to an input of the time slot circuit, an output of the time slot circuit being coupled to a first input of the slope detector circuit, the input of the phase-locked loop being coupled to a second input of the slope detector circuit, means coupling an output of the slope detector circuit to the output of the detection means, and wherein the slope detector circuit provides a detection signal at its output if there is at least one level transition in a signal applied to its second input within a time slot determined by the time slot circuit.

2. An arrangement as claimed in claim 1, wherein the slope detector circuit is adapted to supply a detection signal in the form of a pulse, and further comprising a pulse stretcher coupled between the output of the slope detector circuit and the output of the detection means for stretching the pulse of the slope detector circuit to a pulse having a given nominal pulse width.

3. An arrangement as claimed in claim 2, wherein the pulse stretcher is adapted to stretch said pulse having a nominal pulse width by at least a value corresponding to the time interval between the pulse of the slope detector circuit and a subsequent pulse of the slope detector circuit if said time interval is smaller than the said nominal pulse width.

4. An arrangement as claimed in claim 3, further comprising an integrator coupled between the output of the slope detector circuit and an input of the pulse stretcher.

5. An arrangement as claimed in any one of claims 1 to 3 further comprising a delay means coupled between the output of the phase-locked loop and the input of the hold circuit.

6. An arrangement as claimed in any one of claims 1 to 3, wherein the arrangement is incorporated in a video recorder for demodulating, after reading a registration carrier, an audio signal which is written in FM-modulated form into the registration carrier, wherein the arrangement further comprises:
   two or more reading heads provided on a rotatable head drum,
   switching means having two or more inputs, an output and a control input, which switching means are adapted to couple one of the inputs to the output under the influence of a control signal applied to the control input, an output of each of the two or more reading heads being coupled to an associated input of the two or more inputs of the switching means and the output of the switching means being coupled to an input of
   a limiter which is coupled between the input terminal of the arrangement and an input of the detection means.

7. An arrangement as claimed in claim 1 for demodulating FM-modulated audio signals and further comprising:
   first and second read heads for supplying said audio signals,
   switching means having first and second inputs coupled to said first and second read heads, respectively, and
   a limiter coupled between an output of the switching means and said second input of the slope detector circuit.

* * * * *